United States Patent
Wang et al.

(10) Patent No.: US 11,348,917 B2
(45) Date of Patent: May 31, 2022

(54) SEMICONDUCTOR DEVICE WITH ISOLATION STRUCTURE

(71) Applicant: Taiwan Semiconductor Manufacturing Co., Ltd., Hsinchu (TW)

(72) Inventors: Chieh-Ping Wang, Hsinchu (TW); Tai-Chun Huang, Hsin-Chu (TW); Yung-Cheng Lu, Hsinchu (TW); Ting-Gang Chen, Taipei (TW); Chi On Chui, Hsinchu (TW)

(73) Assignee: Taiwan Semiconductor Manufacturing Co., Ltd.

( * ) Notice: Subject to any disclaimer, the term of this patent is extended or adjusted under 35 U.S.C. 154(b) by 43 days.

(21) Appl. No.: 16/863,371

(22) Filed: Apr. 30, 2020

(65) Prior Publication Data

US 2021/0343709 A1  Nov. 4, 2021

(51) Int. Cl.
| | |
|---|---|
| *H01L 27/088* | (2006.01) |
| *H01L 21/8234* | (2006.01) |
| *H01L 21/8238* | (2006.01) |
| *H01L 27/092* | (2006.01) |
| *H01L 27/105* | (2006.01) |

(52) U.S. Cl.
CPC .. *H01L 27/0886* (2013.01); *H01L 21/823431* (2013.01); *H01L 21/823481* (2013.01); *H01L 21/823821* (2013.01); *H01L 21/823878* (2013.01); *H01L 27/0924* (2013.01); *H01L 27/1052* (2013.01)

(58) Field of Classification Search
CPC ............. H01L 27/0886; H01L 27/0924; H01L 27/1052; H01L 21/823431; H01L 21/823481; H01L 21/823821; H01L 21/823878

See application file for complete search history.

(56) References Cited

U.S. PATENT DOCUMENTS

| | | | |
|---|---|---|---|
| 2013/0249048 A1* | 9/2013 | Kim | .................. H01L 21/762 257/506 |
| 2019/0165155 A1 | 5/2019 | Chang et al. | |
| 2019/0288690 A1* | 9/2019 | Yeap | ................... H01L 27/1203 |
| 2019/0305099 A1* | 10/2019 | Jo | ..................... H01L 29/41791 |

FOREIGN PATENT DOCUMENTS

| | | |
|---|---|---|
| KR | 20190064389 A | 6/2019 |
| KR | 20190112910 | 10/2019 |

* cited by examiner

*Primary Examiner* — Christine A Enad
(74) *Attorney, Agent, or Firm* — Sterne, Kessler, Goldstein & Fox P.L.L.C.

(57) ABSTRACT

A semiconductor device with isolation structures of different dielectric constants and a method of fabricating the same are disclosed. The semiconductor device includes fin structures with first and second fin portions disposed on first and second device areas on a substrate and first and second pair of gate structures disposed on the first and second fin portions. The second pair of gate structures is electrically isolated from the first pair of gate structures. The semiconductor device further includes a first isolation structure interposed between the first pair of gate structures and a second isolation structure interposed between the second pair of gate structures. The first isolation structure includes a first nitride liner and a first oxide fill layer. The second isolation structure includes a second nitride liner and a second oxide fill layer. The second nitride liner is thicker than the first nitride liner.

20 Claims, 12 Drawing Sheets

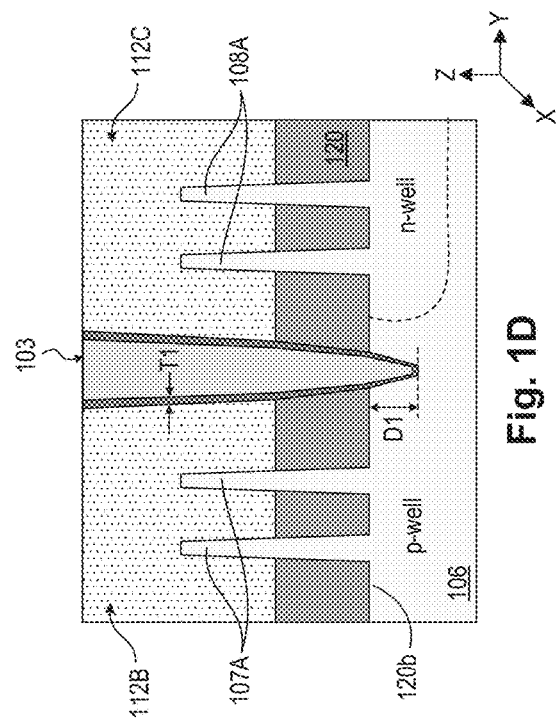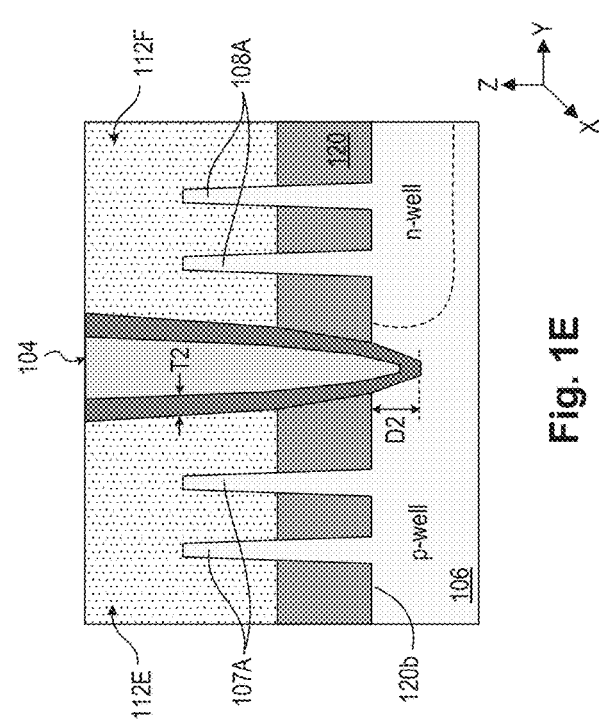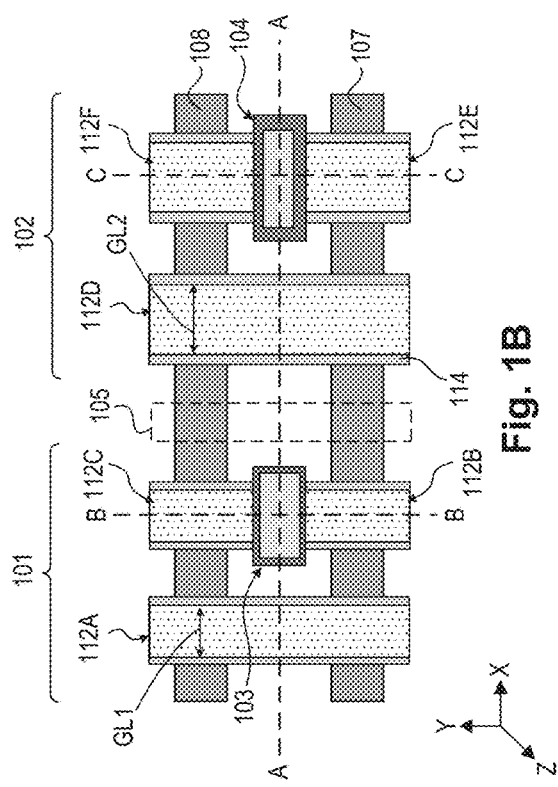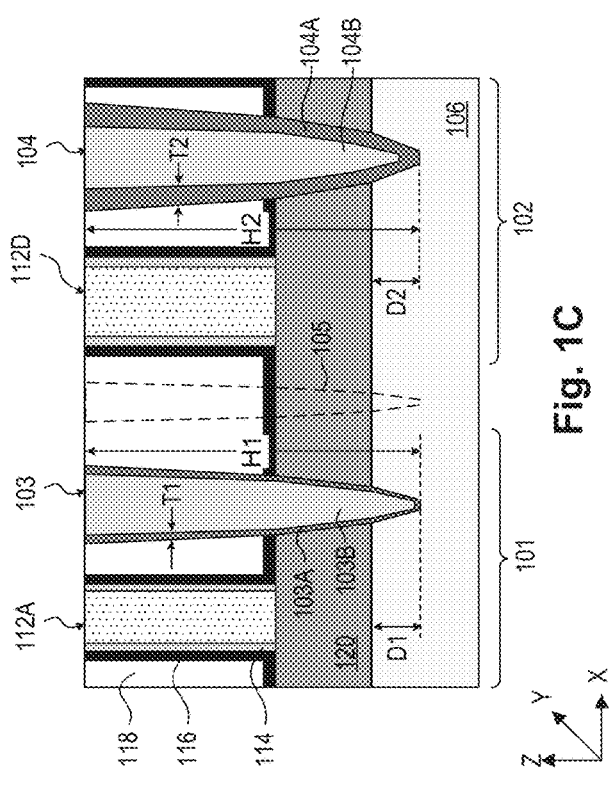
Fig. 1B
Fig. 1C
Fig. 1D
Fig. 1E

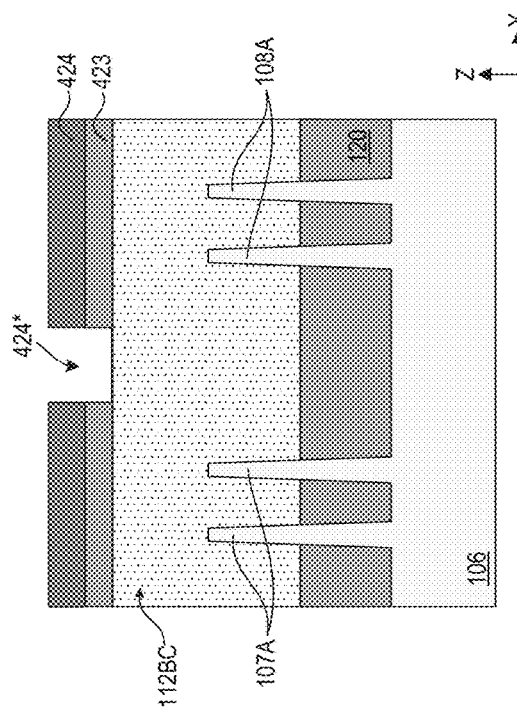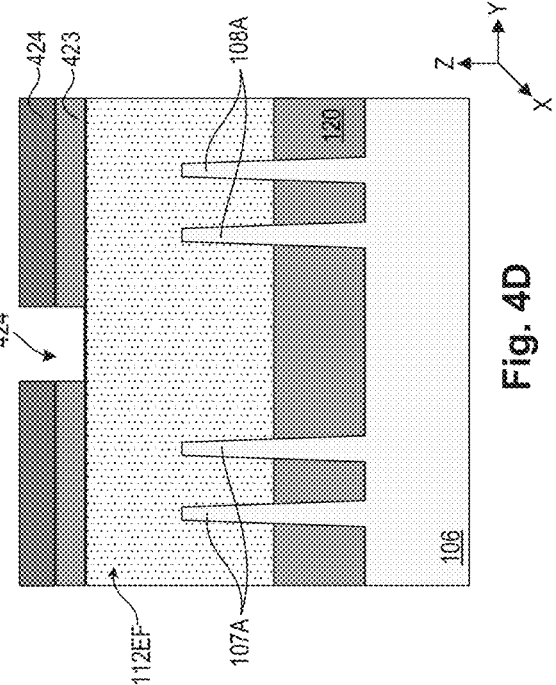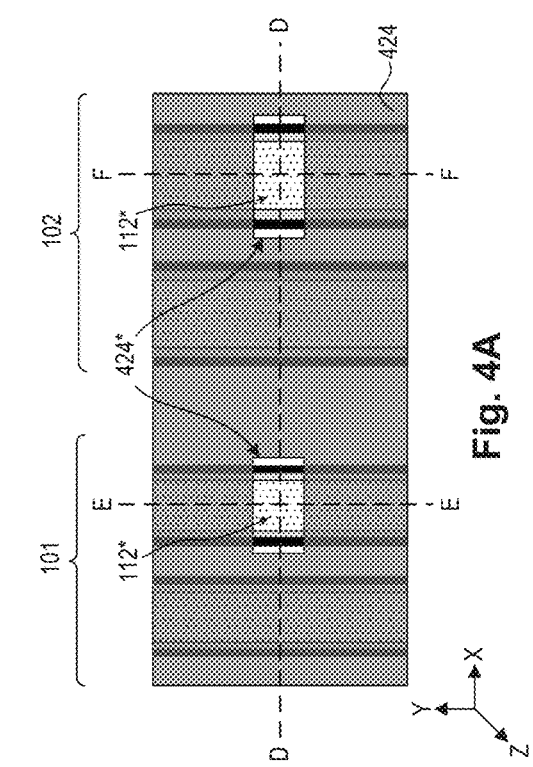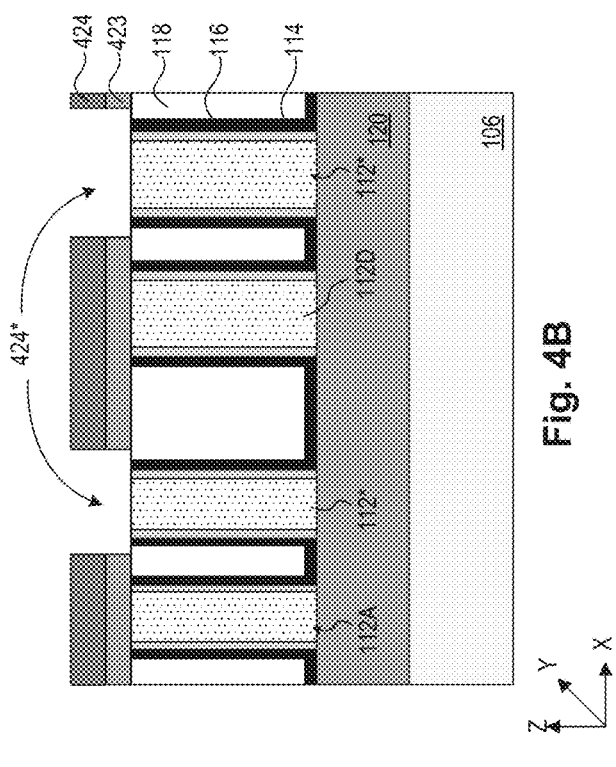

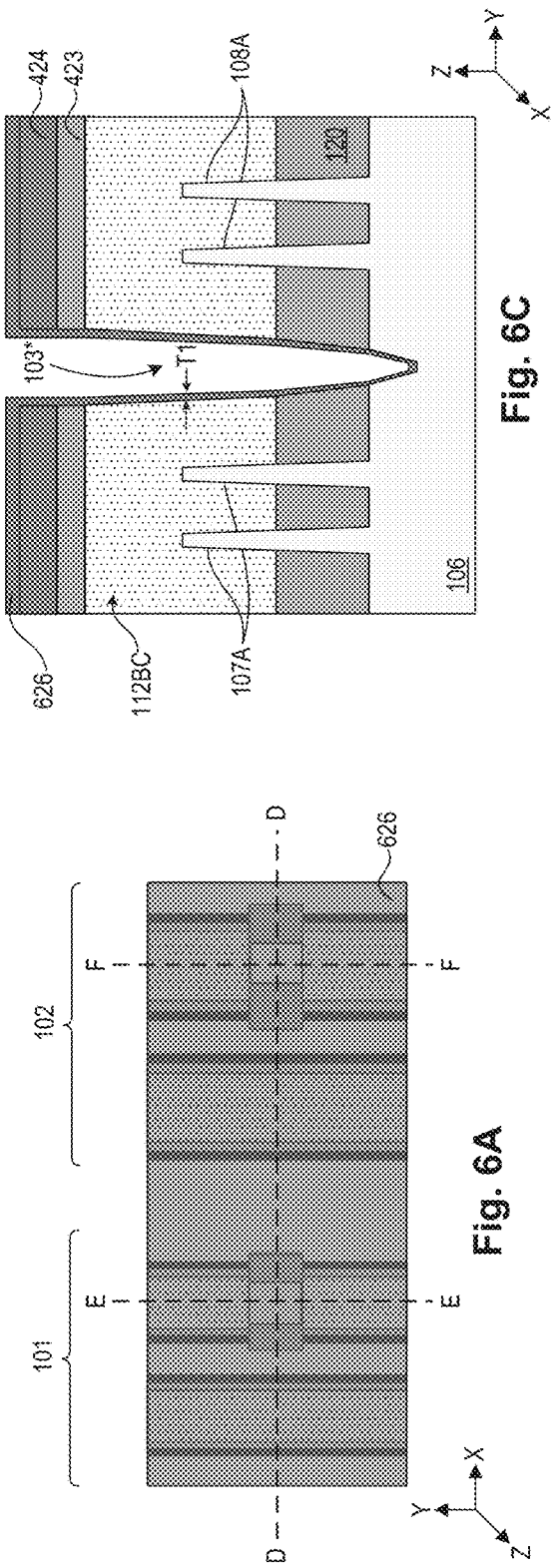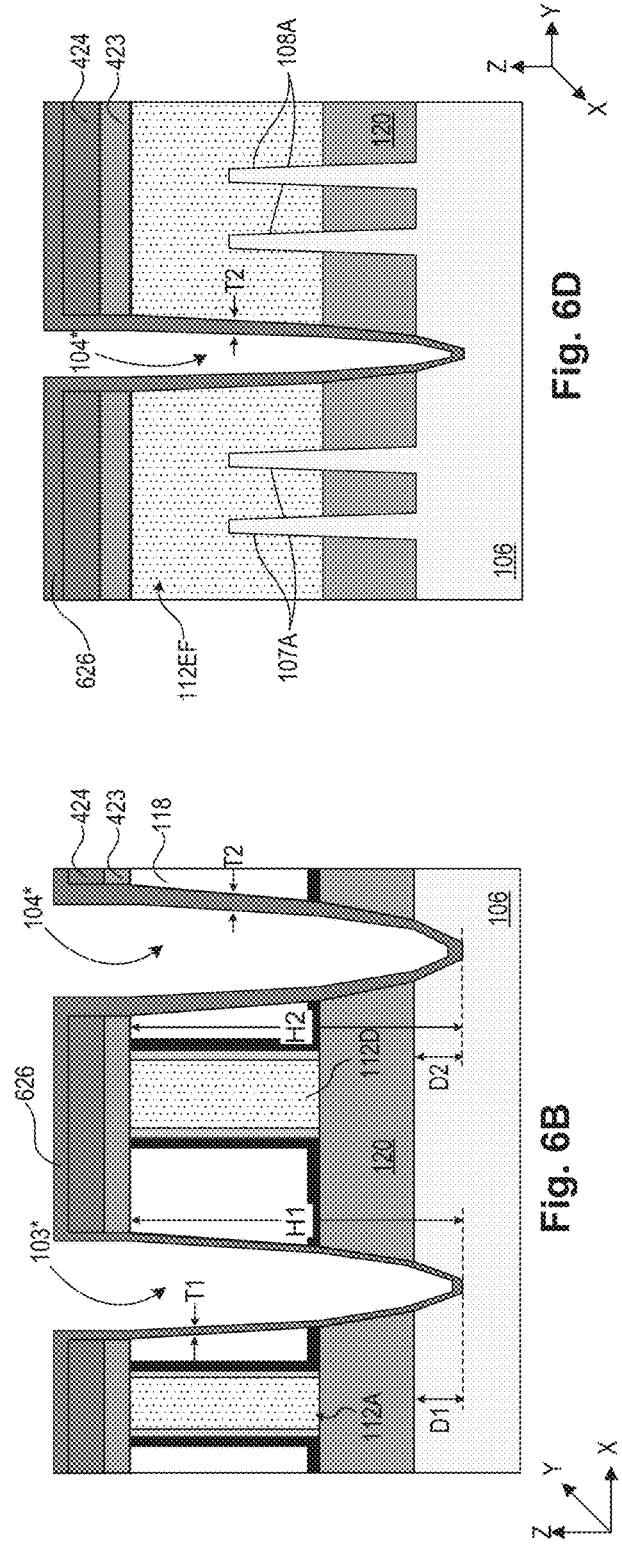

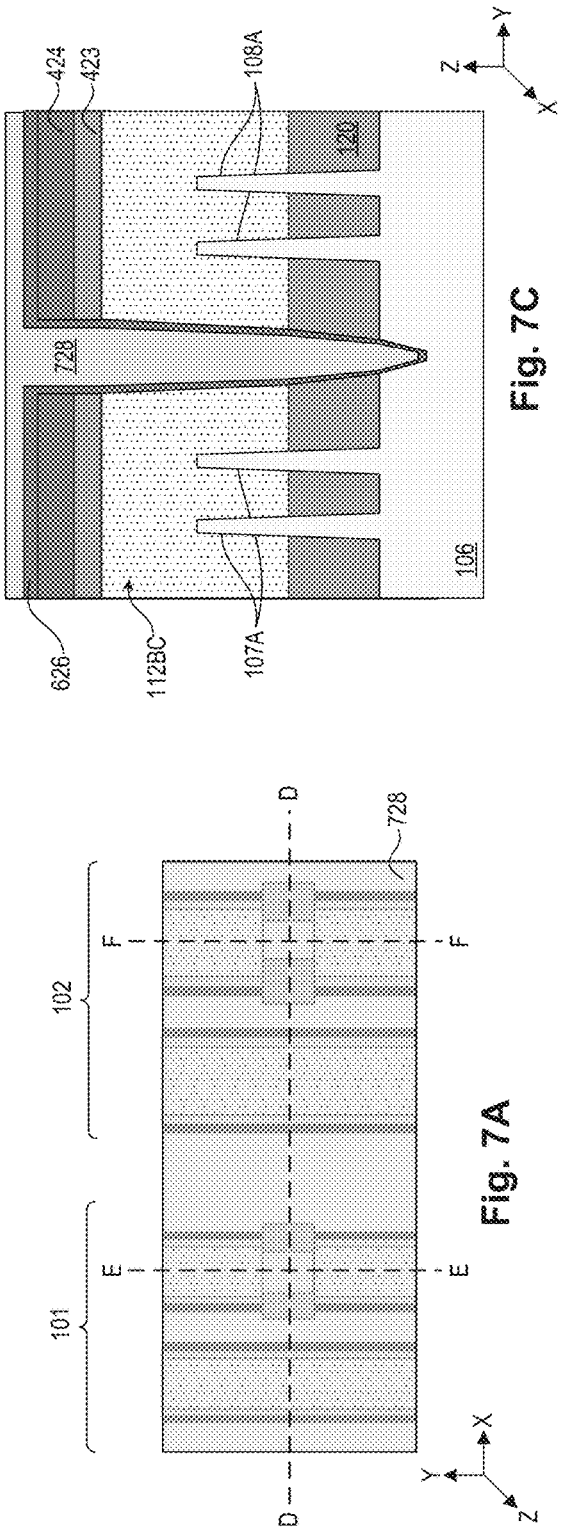
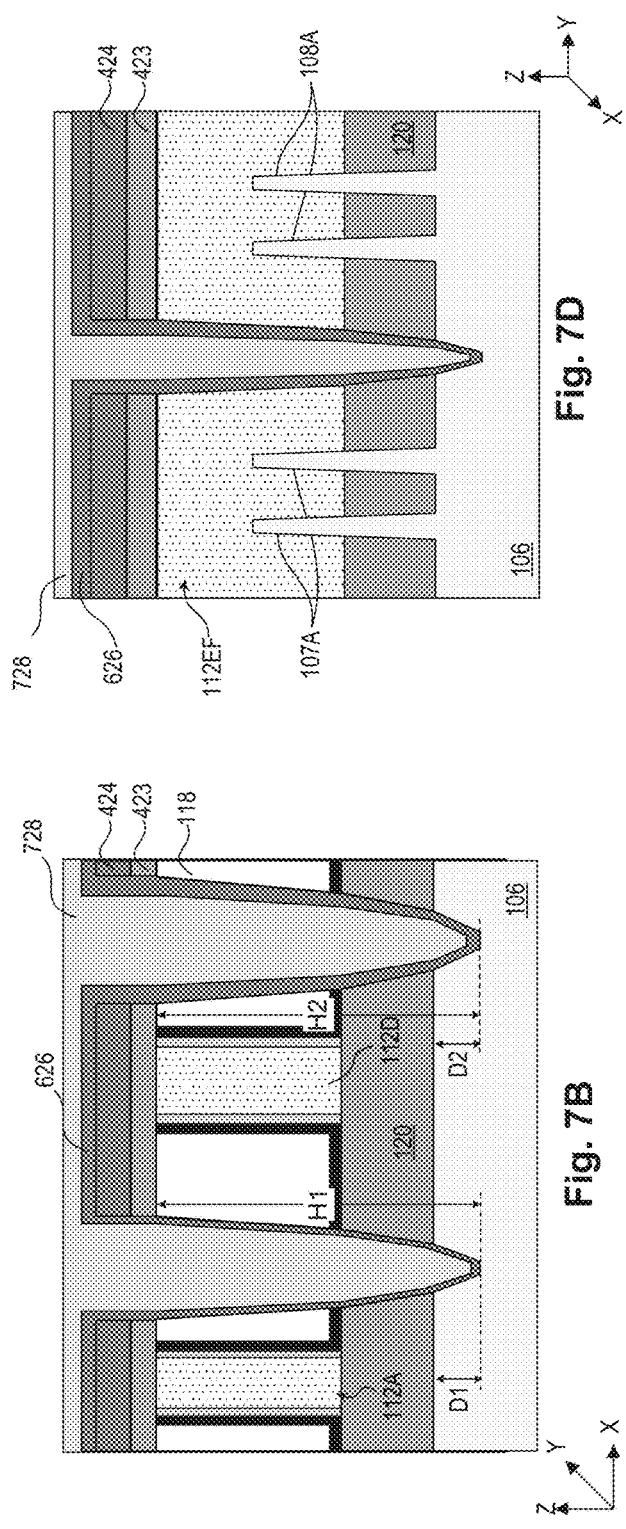
Fig. 7A
Fig. 7B
Fig. 7C
Fig. 7D

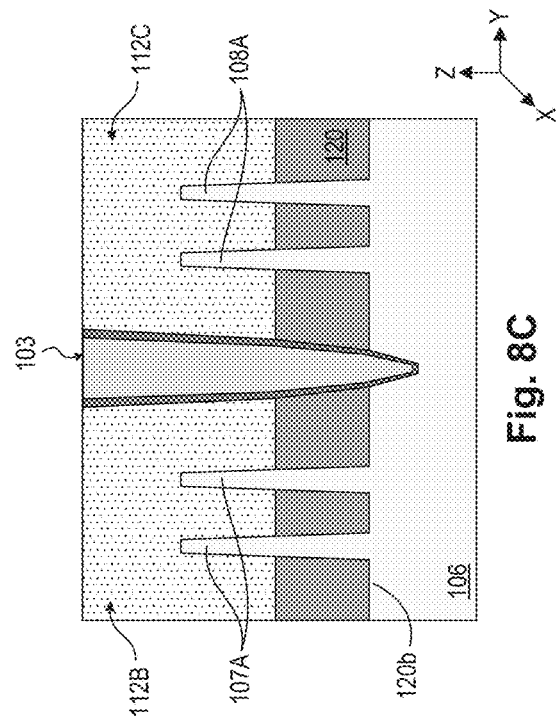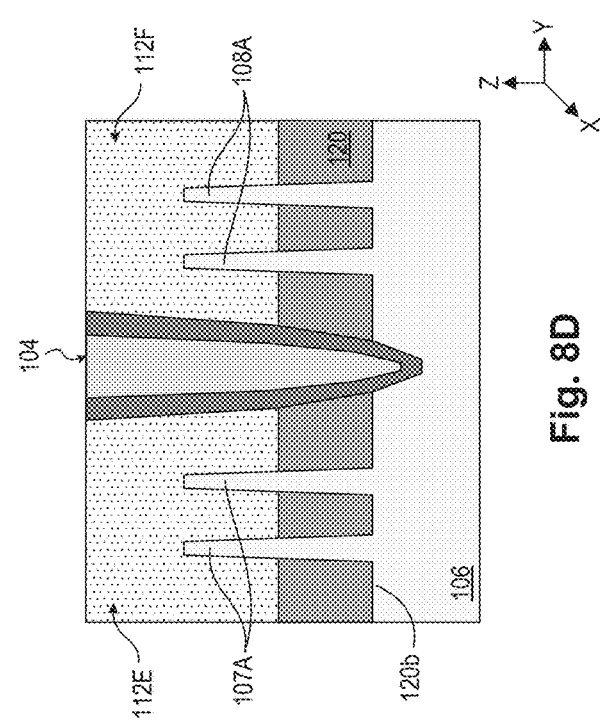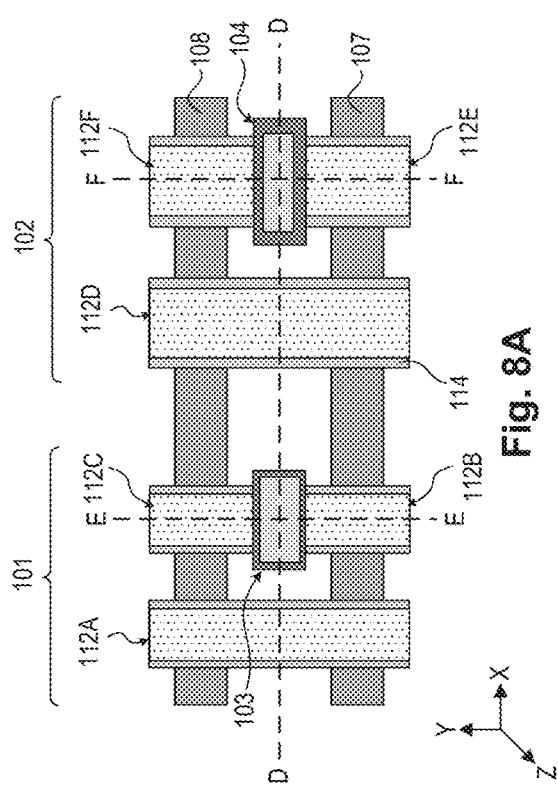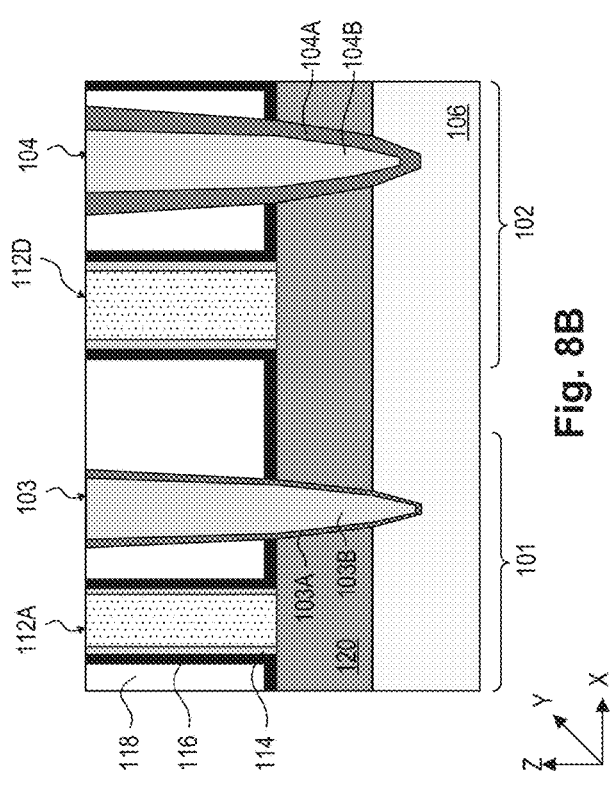

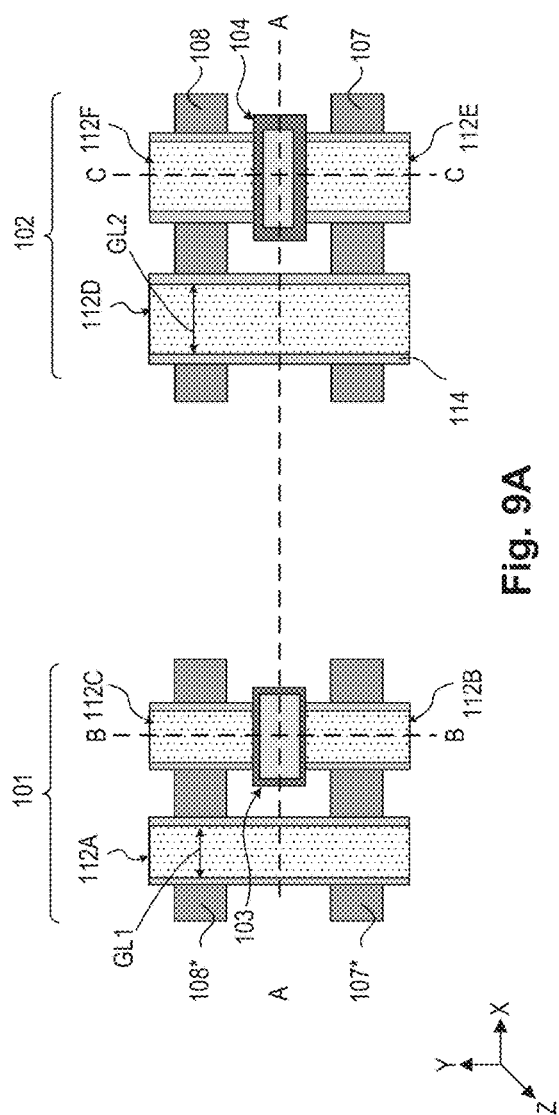
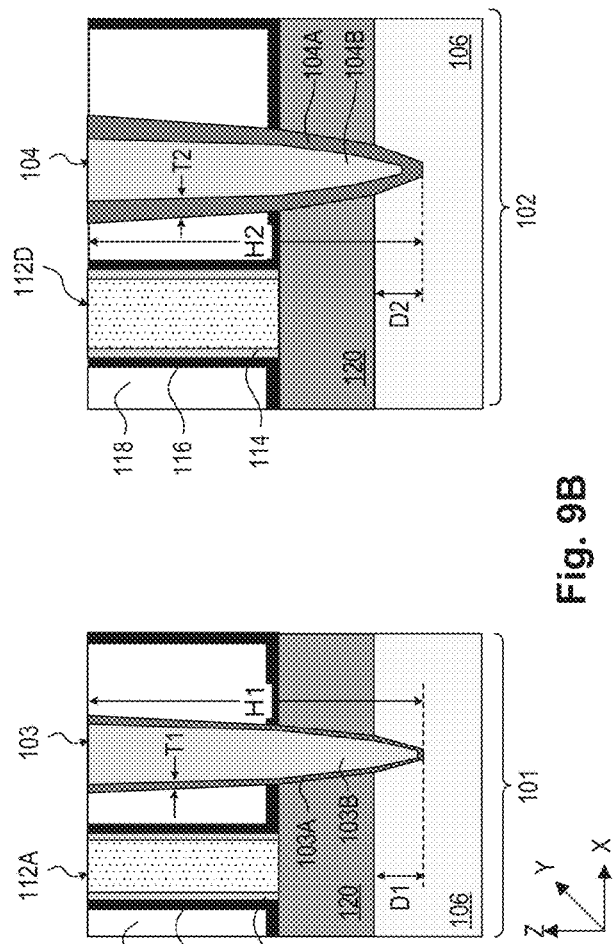
Fig. 9A
Fig. 9B

US 11,348,917 B2

SEMICONDUCTOR DEVICE WITH ISOLATION STRUCTURE

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs, fin field effect transistors (finFETs), and interconnect structures for the semiconductor devices. Such scaling down has increased the complexity of semiconductor manufacturing processes.

BRIEF DESCRIPTION OF THE DRAWINGS

Aspects of this disclosure are best understood from the following detailed description when read with the accompanying figures.

FIGS. 1B-1E illustrate a top view and cross-sectional views of a semiconductor device with isolation structures, in accordance with some embodiments.

FIGS. 3A-8D illustrate cross-sectional views of a semiconductor device with isolation structures at various stages of its fabrication process, in accordance with some embodiments.

FIGS. 9A-9D illustrate a top view and cross-sectional views of a semiconductor device with isolation structures, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
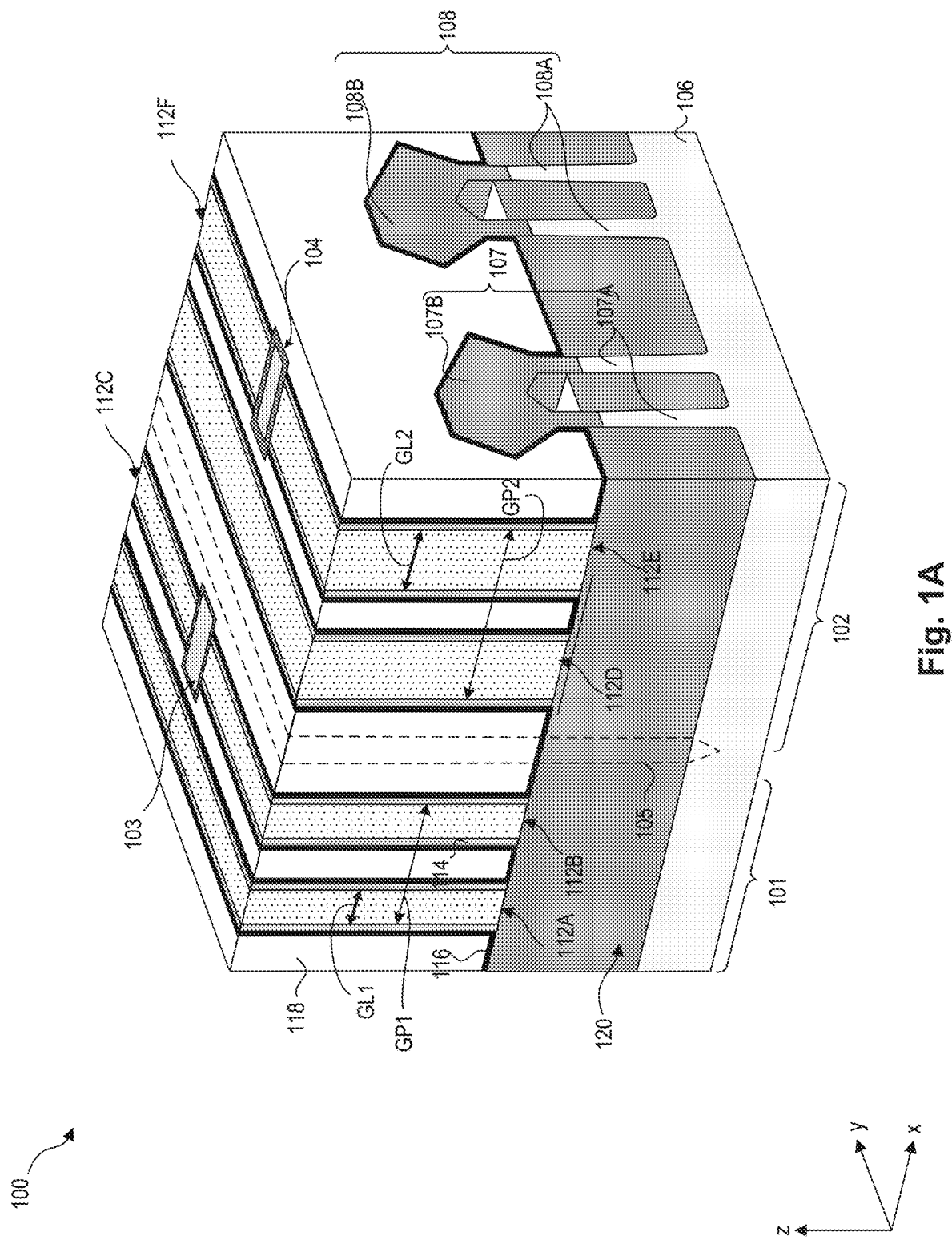
FIG. 1A illustrates an isometric view of a semiconductor device with isolation structures, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary embodiment," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "etch selectivity" refers to the ratio of the etch rates of two different materials under the same etching conditions.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As used herein, the term "low-k" refers to a low dielectric constant. In the field of semiconductor device structures and manufacturing processes, low-k refers to a dielectric constant that is less than the dielectric constant of $SiO_2$ (e.g., less than 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

As used herein, the term "conductive" refers to an electrically conductive structure, layer, and/or region.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

Gate structures in semiconductor devices with finFETs can extend over two or more of the finFETs. For example, the gate structures can be formed as long gate structures extending across the active regions (e.g., fin regions) of the finFETs. Once the gate structures are formed, a patterning process can "cut" one or more of the long gate structures into shorter sections according to the desired structure. In other words, the patterning process can remove redundant gate portions of the one or more long gate structures to form one or more isolation trenches (also referred to as "metal cuts") between the finFETs and separate the long gate structures into shorter sections. This process is referred to as a cut-metal-gate (CMG) process. Subsequently, the isolation trenches formed between the separated sections of the long gate structures can be filled with a dielectric material, such as silicon nitride (SiN) to form isolation structures, which can electrically isolate the separated gate structure sections.

The isolation structures with the gate structure sections can form parasitic capacitors, which in turn produce undesirable parasitic capacitances in the semiconductor devices. The larger the number of isolation structures formed by the CMG process, the higher the accumulation of parasitic capacitances in the semiconductor devices. The parasitic capacitances are further exacerbated by the isolation structures' high dielectric constant due to the dielectric constant (e.g., about 6.5 to about 8) of the SiN fill in the isolation structures. The parasitic capacitances can adversely impact device performance, such as increase RC time delay in the semiconductor devices.

The present disclosure provides example isolation structures for reducing parasitic capacitance in a semiconductor device with finFETs and example methods for fabricating the same. In some embodiments, the isolation structure can be formed by partially replacing the SiN fill with a lower dielectric constant material, such as silicon oxide ($SiO_2$) and a $SiO_2$-based material (e.g., silicon oxycarbide (SiOC)) to reduce the dielectric constant of the isolation structure. The isolation structure can be formed by depositing a SiN liner in the isolation trench, followed by filling the isolation trench with $SiO_2$ or a $SiO_2$-based material. Since $SiO_2$ and the $SiO_2$-based material has a dielectric constant equal to or less than about 3.9, the bi-layer dielectric stack of SiN and $SiO_2$ or SiN and $SiO_2$-based material can reduce the dielectric constant of the isolation structure by about 30% to about 50% compared to isolation structures with only a SiN fill. Further, the isolation structure can extend into the substrate of the semiconductor device and provide electrical isolation between p- and n-well regions under the finFETs. In some embodiments, the isolation structure can be formed to cut fin structures of the finFETs to electrically separate fin structures from each other.

In some embodiments, the isolation structures with different dielectric constants can be formed at the same time in different device areas (e.g., memory device area and logic device area) of the semiconductor device. The dielectric constant of the isolation structures can be different by varying the thickness of the SiN liner in the bi-layer dielectric stack. The process of forming the isolation structures with different dielectric constants at the same time can eliminate CMG process-related variability associated with forming multiple isolation structures across the semiconductor device. Reducing process-related variability across the semiconductor device can reduce the performance variability across the finFETs and device manufacturing cost.

A semiconductor device 100 with a memory device area 101 and a logic device area 102 is described with reference to FIGS. 1A-1F, according to some embodiments. FIG. 1A illustrates an isometric view of semiconductor device 100, according to some embodiments. Semiconductor device 100 can be formed on a substrate 106. Substrate 106 can be a semiconductor material, such as silicon, germanium (Ge), silicon germanium (SiGe), a silicon-on-insulator (SOI) structure, and a combination thereof. Further, substrate 106 can be doped with p-type dopants (e.g., boron, indium, aluminum, or gallium) or n-type dopants (e.g., phosphorus or arsenic). In some embodiments, substrate 106 can include n- and p-well regions (not shown in FIG. 1A).

Referring to FIG. 1A, semiconductor device 100 can include isolation structures 103-104, fin structures 107-108 extending along an X-axis, gate structures 112A-112F extending along a Y-axis, gate spacers 114, an etch stop layer (ESL) 116, an inter-layer dielectric (ILD) layer 118, and shallow trench isolation (STI) regions 120. Fin structures 107-108 can be electrically isolated from each other. ESL 116, ILD layer 118, and STI region 120 can include dielectric materials, such as silicon oxide, silicon nitride, silicon germanium oxide, and a combination thereof. Gate structures 112A-112F can be electrically isolated from each other by gate spacers 114, ESL 116, and ILD layer 118. Gate spacers 114 can include an insulating material, such as silicon oxide, silicon nitride, silicon oxynitride, a low-k material, and combination thereof.

Gate structures 112A-112C with portions of fin structures 107-108 in memory device area 101 form the finFETs of memory device area 101. The finFETs in memory device area 101 can be memory devices or part of a memory device. Gate structures 112D-112F with portions of fin structures 107-108 in logic device area 102 form the finFETs of logic device area 102. The finFETs in logic device area 102 can be logic devices or part of a logic device. Gate structures 112A-112C have a gate pitch GP1 and gate lengths GL1 smaller than respective gate pitch GP2 and gate lengths GL2 of gate structures 112D-112F. The gate pitch is defined as a sum of a distance along an X-axis between adjacent gate structures with equal gate lengths and a gate length (e.g., GL1-GL2 shown in FIG. 1A) of one of the adjacent gate structures. Though three gate structures are shown in each of device areas 101-102, each of devices areas 101-102 can any number of gate structures. Since gate pitch GP1 is smaller than gate pitch GP2, memory device area 101 can have a larger number of gate structures, and as a result a larger number of finFETs per unit device area compared to logic device area 102. Thus, memory device area 101 is a high density device area with denser patterned structures than logic device area 102, which is a low density device area.

In some embodiments, in addition to gate spacers 114, ESL 116, and ILD layer 118, gate structures 112B-112C can be electrically isolated from each other by isolation structure 103 and gate structures 112E-112F can be electrically isolated from each other by isolation structure 104 to provide independently-controlled gate structures. Isolation structures 103-104 can be formed at the same time with dielectric constants different from each other in a CMG process (described in further detail below) to cut long gate structures (e.g., along a Y-axis) formed on fin structures 107-108 into shorter gate structures, such as gate structures 112B-112C and 112E-112F. The different dielectric constants of isolation structures 103-104 are adjusted to reduce the parasitic capacitances of semiconductor device 100. Though one isolation structure is shown in each of device areas 101-102, each of devices areas 101-102 can any number of isolation structures. In some embodiments, semiconductor device 100 can further include an isolation structure 105 extending along an Z-axis and into substrate 106 to cut fin structures 107-108 and to electrically isolate the portions of fin structures 107-108 in memory device area 101 from those in logic device area 102. Similar to isolation structure 103 or 104, isolation structure 105 can include the bi-layer dielectric stack of SiN and SiO$_2$ or SiN and SiO$_2$-based material.

FIG. 1B illustrates a top view of semiconductor device 100 without ESL 116 and ILD layer 118 so that fin structures 107-108 are visible. FIGS. 1C-1E illustrate cross-sectional views along lines A-A, B-B, and C-C of FIG. 1B.

Referring to FIGS. 1A-1E, fin structures 107-108 can include fin regions 107A-108A and epitaxial regions 107B-108B disposed on respective fin regions 107A-108A. Portions of fin regions 107A-108A under epitaxial regions 107B-108B can be recessed within STI region 120 compared to portions of fin regions 107A-108A under gate structures 112A-112F. Fin regions 107A-108A can include a material similar to substrate 106 and can be formed from patterning and etching substrate 106. In some embodiments, fin regions 107A-108A can include a semiconductor material different from substrate 106 and can be formed from patterning and etching an epitaxial layer grown on substrate 106. In some embodiments, fin regions 107A-108A can have a semiconductor material with a crystalline microstructure—e.g., a non-amorphous or non-polycrystalline microstructure.

Epitaxial regions 107B-108B are formed on portions of respective fin regions 107A-108A, which are not covered by gate structures 112A-112F. Epitaxial regions 107B-108B can be source/drain (S/D) regions of the finFETs of semiconductor device 100 and can include epitaxially-grown semiconductor materials similar to or different from each other. In some embodiments, the epitaxially-grown semiconductor material can include the same material or a different material from the material of substrate 106. Depending on the conductivity type of the finFETs, epitaxial regions 107B-108B can include (i) boron (B) doped SiGe, B-doped Ge, or B-doped germanium tin (GeSn) for p-type finFETs; and (ii) carbon-doped Si (Si:C), phosphorous doped Si (Si:P) or arsenic doped Si (Si:As) for n-type finFETs. Further, epitaxial regions 107B-108B can include multiple layers with different dopant concentration and/or different material composition.

Gate structures 112A-112F are isolated from epitaxial regions 107B-108B by gate spacers 114. Gate structure 112A-112F can be multi-layered structures. The different layers of gate structures 112A-112F are not shown for simplicity. Each of gate structure 112A-112F can include an interfacial oxide (IO) layer, a high-k gate dielectric layer on the IO layer, a work function metal (WFM) layer on the high-k dielectric layer, and a gate metal fill layer on the WFM layer. The IO layer can include silicon oxide (SiO$_2$) silicon germanium oxide (SiGeO$_x$) or germanium oxide (GeO$_x$). The high-k gate dielectric layer can include a high-k dielectric material, such as hafnium oxide (HfO$_2$), titanium oxide (TiO$_2$), hafnium zirconium oxide (HfZrO), tantalum oxide (Ta$_2$O$_3$), hafnium silicate (HfSiO$_4$), zirconium oxide (ZrO$_2$), and zirconium silicate (ZrSiO$_2$). The WFM layer can include titanium aluminum (TiAl), titanium aluminum carbide (TiAlC), tantalum aluminum (TaAl), tantalum aluminum carbide (TaAlC), and a combination thereof. The gate metal fill layer can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof.

Referring to FIGS. 1B-1E, isolation structures 103-104 can be formed with similar heights H1, but with different average widths along an X-axis. The average width of isolation structure 103 is smaller than that of isolation structure 104 since gate length GL1 is smaller than gate length GL2. The average widths of isolation structures 103-104 correspond to respective gate lengths GL1-GL2 because isolation structures 103-104 are formed by removing redundant gate portions between gate structures 112B-112C and between gate structures 112E-112F. In some embodiments, the average widths of isolation structures 103-104 also depend on the thickness of gate spacers 114 and ESL 116 because the portions of gate spacers 114 and ESL 116 adjacent to the redundant gate portions are removed to form isolation structures 103-104, as described in further detail below. In some embodiments, the average width of isolation structure 103 can range from about 20 nm to about 30 nm and the average width of isolation structure 104 can range from about 30 nm to about 40 nm. Thus, isolation structures formed in high density device areas (e.g., isolation structure 103 in memory device area 101) are narrower along an X-axis than isolation structures formed in low density device areas (e.g., isolation structure 104 in logic device area 102).

In some embodiments, heights H1-H2 can range from about 150 nm to about 300 nm with portions of isolation structures 103-104 extending distances D1-D2 into substrate 106, as shown in FIGS. 1B-1E. The portions of isolation structures 103-104 in substrate 106 provide electrical isolation between p- and n-well regions (shown in FIGS. 1D-1E) when p- and n-well regions are formed in substrate 106. Thus, if heights H1-H2 are shorter than about 150 nm and/or distances D1-D2 are shorter than about 5 nm, there may be leakage between the p- and n-well regions, which can negatively impact device performance. On the other hand, if heights H1-H2 are greater than about 300 nm and/or distances D1-D2 are greater than about 150 nm, the process time (e.g., the etching and dielectric filling times) to form isolation structures 103-104 increases, consequently increasing device manufacturing cost. In some embodiments, heights H1-H2 can be equal to or different from each other. In some embodiments, distances D1-D2 can be equal to or different from each other. In some embodiments, height H2 can be greater than height H1 and distance D2 can greater than distance D1.

In some embodiments, isolation structure 103 can include a bi-layer dielectric stack of a nitride liner 103A and an oxide fill layer 103B, and isolation structure 104 can include a bi-layer dielectric fill of a nitride liner 104A and an oxide fill layer 104B. Nitride liners 103A-104A can include SiN material and oxide fill layers 103B-104B can include SiO$_2$ or SiO$_2$-based material (e.g., silicon oxycarbide). Thickness T1 of nitride liner 103A is less than thickness T2 of nitride liner 104A and thicknesses T1-T2 can each range from about 4 nm to about 6 nm. Similarly, the average thickness of oxide fill layer 103B along an X-axis is less than the average thickness of oxide fill layer 104B. The average thickness of oxide fill layer 103B can range from about 15 nm to about 25 nm and the average thickness of oxide fill layer 104B can range from about 25 nm to about 35 nm. In some embodiments, a thickness ratio between nitride liner 103A and oxide fill 103B and between nitride liner 104A and oxide fill 104B can be between about 1:4 and about 1:10.

Since oxide fill layers 103B-104B have a lower dielectric constant (e.g., about 3.9) than nitride liners 103A-104A (e.g., about 6.5 to about 8) and the volumes occupied by oxide fill layers 103B-104B in isolation structures 103-104 are larger than that of nitride liners 103A-104A, the resulting dielectric constant of each isolation structures 103-104 is closer to the dielectric constant of oxide fill layers 103B-104B (e.g., about 4 to about 6). Thus, the impact on the parasitic capacitances from isolation structures 103-104 is reduced compared to isolation structures with only SiN fill. In some embodiments, since thickness T1 of nitride liner 103A is less than thickness T2 of nitride liner 104A and a volume occupied by oxide fill layer 103B is smaller than that occupied by oxide fill layer 104B, dielectric constant of isolation structure 103 is lower than that of isolation structure 104. Lower dielectric constant of isolation structure 103 is achieved with thinner nitride liner 103A because the performance of devices in memory device area 101 can be more sensitive to parasitic capacitance than that of devices in logic device area 102.

In some embodiments, the thinner nitride liners 103A-104A, the lower the dielectric constant of the resulting isolation structures 103-104. In other words, the larger the volume occupied by oxide fill layers 103B-104B in isolation structures 103-104 at the expense of nitride liners 103A-104A, the lower the dielectric constants of isolation structures 103-104. In some embodiments, nitride liners 103A-104A have a minimum thickness to prevent oxygen diffusion into the layers of gate structure 112B-112C and 112E-112F from oxide fill layers 103B-104B. In addition, the minimum thickness is required for nitride liners 103A-104A to act as etch stop layers and protect oxide fill layers 103B-104B during subsequent formation of adjacent structures, such as isolation structure 105. Thus, nitride liners 103A-104A thinner than about 4 nm may not adequately block oxygen diffusion and/or adequately perform as etch stop layers, which can result in undesirable threshold voltage shifts in the finFETs. On the other hand, nitride liners 103A-104A thicker than about 6 nm adequately block oxygen diffusion and/or adequately perform as etch stop layers, but at the same time increases the dielectric constant of isolation structures 103-104 and the parasitic capacitance of semiconductor device 100 above a threshold value that increases the RC time delay of semiconductor device 100.

In some embodiments, in addition to the minimum thickness required for nitride liners 103A-104A to effectively act as etch stop layers for oxide fill layers 103B-104B, nitride liners 103A-104A have a minimum film density and a minimum wet etch rate to be effective etch stop layers. The wet etch rate can be defined as the etch rate of a material in dilute hydrofluoric (HF) acid (e.g., 1:50 dilute HF acid). In some embodiments, the film density of nitride liners 103A-104A can range from about 2.9 g/cm$^3$ to about 3.2 g/cm$^3$ and the wet etch rate can range from about 0.5 nm/min to about 3 nm/min. If nitride liners 103A-104A have a density less than about 2.9 g/cm$^3$ and/or a wet etch rate lower than about 0.5 nm/min, nitride liners 103A-104A may not adequately perform as etch stop layers to protect oxide fill layers 103B-104B from being etched during subsequent formation of adjacent structures. The film density of nitride liners 103A-104A can be varied by adjusting the hydrogen atom H atom ratio in nitride liners 103A-104A during the deposition of nitride liners 103A-104A.

Figure 1F:
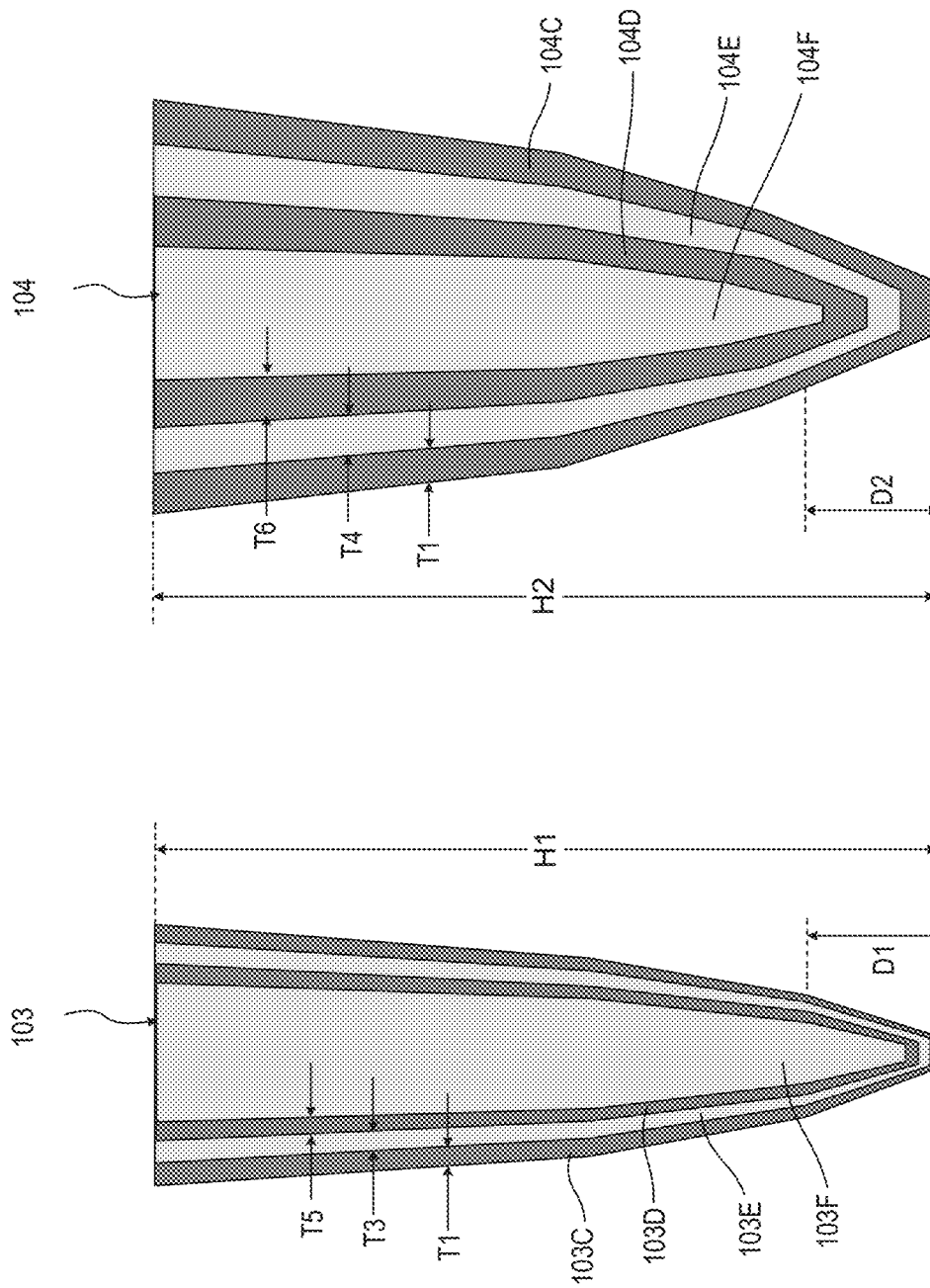
FIG. 1F illustrates cross-sectional views of isolation structures of a semiconductor device, in accordance with some embodiments.

Referring to FIG. 1F, in some embodiments, the dielectric constant of isolation structure 103 can be adjusted more precisely to a desired value by having a dielectric stack of liners 103C-103E and a fill layer 103F instead of the bi-layer dielectric stack of nitride liner 103A and oxide fill layer 103B. Similarly, isolation structure 104 can have a dielectric stack of liners 104C-104E and a fill layer 104F instead of the bi-layer dielectric stack of nitride liner 104A and oxide fill layer 104B. In some embodiments, liners 103C-103D and 104C-104D can include SiN and liner 103E interposed between nitride liners 103C-103D and liner 104E interposed between nitride liners 104C-104D can include $SiO_2$ or $SiO_2$-based material. Fill layers 103F-104F disposed on respective nitride liners 103E-104E can include $SiO_2$ or a $SiO_2$-based material.

The discussion of nitride liners 103A-104A can apply to respective liners 103C-104C unless mentioned otherwise. In some embodiments, thicknesses T5-T6, film density, and/or wet etch rate of nitride liners 103D-104D can be equal to or less than that of respective nitride liners 103C-104D. In some embodiments, thicknesses T3-T4 of oxide liners 103E-104E can be equal to or greater than that of respective nitride liners 103C-104D depending on the desired dielectric constant of isolation structures 103-104. To achieve a lower dielectric constant in isolation structure 103 than that of isolation structure 104, nitride liners 103C-103D are thinner than nitride liners 104C-104D.

Figure 2:
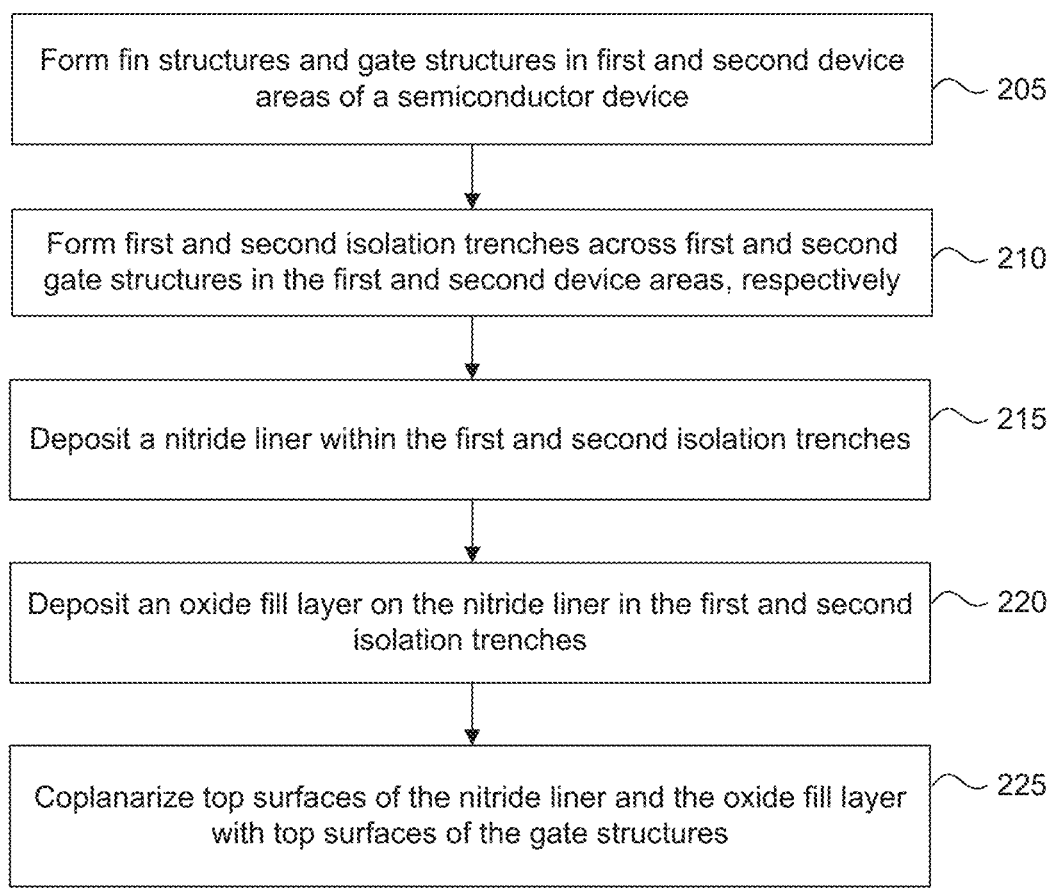
FIG. 2 is a flow diagram of a method for fabricating a semiconductor device with isolation structures, in accordance with some embodiments.
Figure 3A:
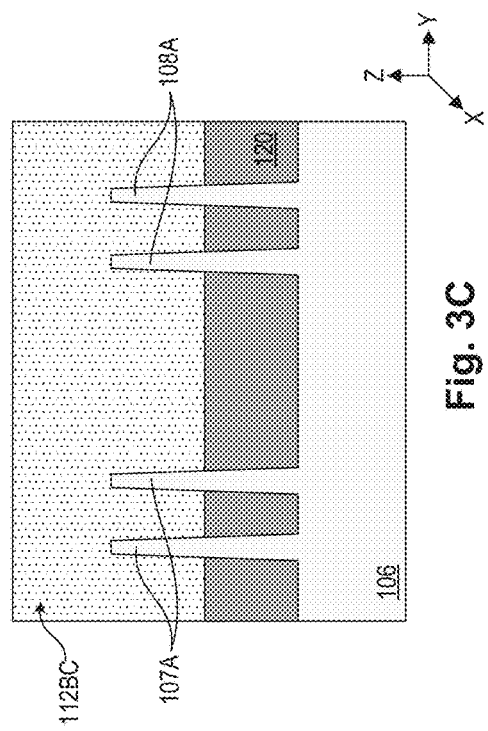
Figure 3C:
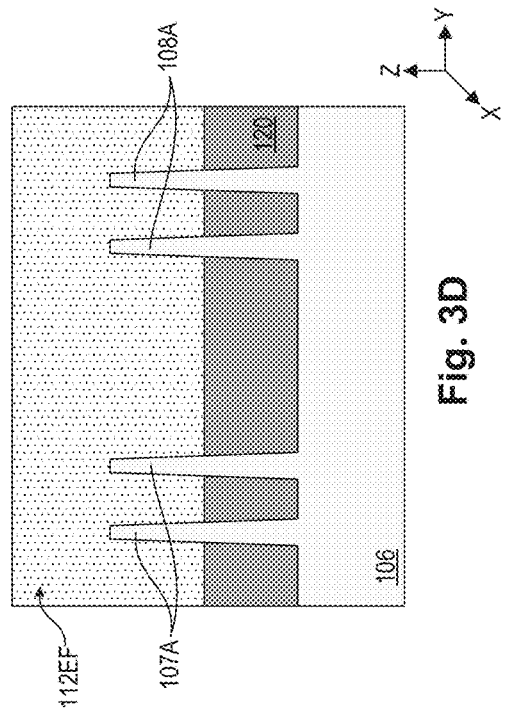
Figure 3B:
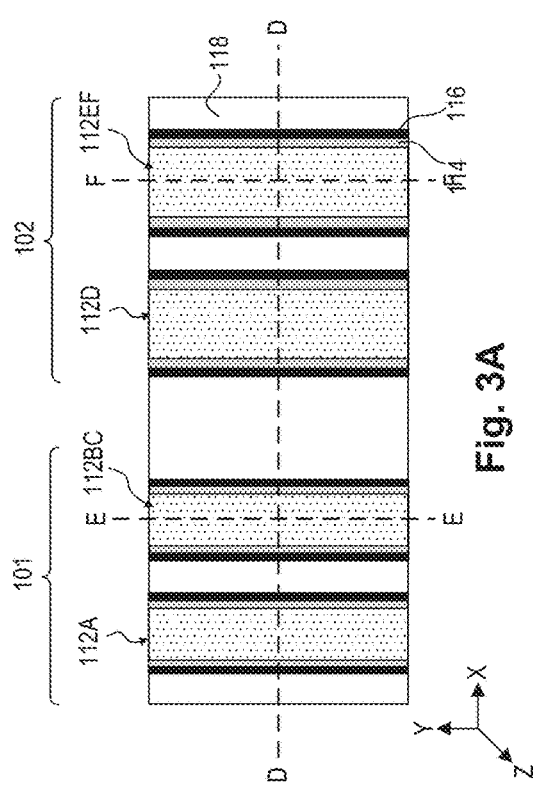
Figure 3D:
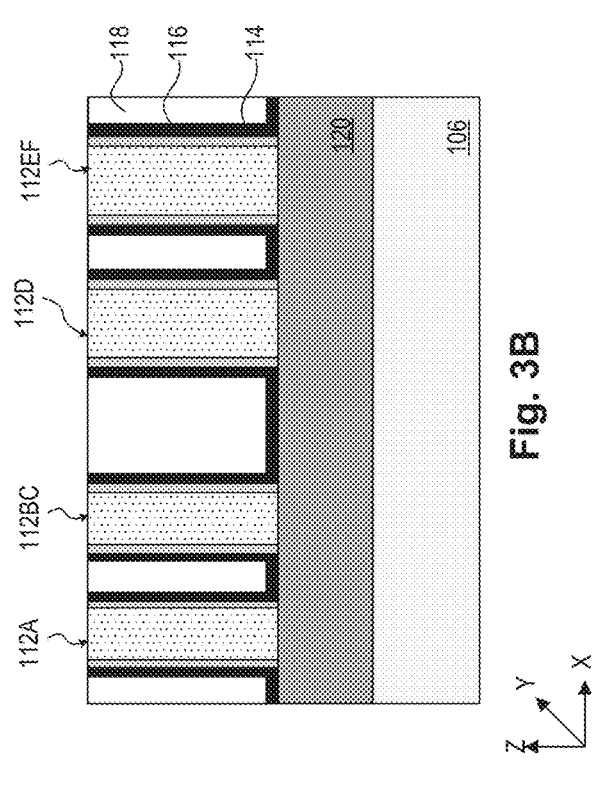

FIG. 2 is a flow diagram of an example method 200 for fabricating semiconductor device 100, according to some embodiments. For illustrative purposes, the operations illustrated in FIG. 2 will be described with reference to FIGS. 3A-8D. FIGS. 3A-8A are top views at various stages of fabricating semiconductor device 100, according to some embodiments. FIGS. 3B-8B, 3C-8C, and 3D-8D are cross-sectional views along respective lines D-D, E-E, and F-F of FIGS. 3A-8A at various stages of fabricating semiconductor device 100, according to some embodiments. Operations can be performed in a different order or not performed depending on specific applications. It should be noted that method 200 may not produce a complete semiconductor device 100. Accordingly, it is understood that additional processes can be provided before, during, and after method 200, and that some other processes may only be briefly described herein. Elements in FIGS. 3A-8D with the same annotations as elements in FIGS. 1A-1F are described above.

In operation 205, fin structures and gate structures in first and second device areas of a semiconductor device are formed. For example, as shown in FIGS. 3A-3D, fin structures 107-108 with fin regions 107A-108A and epitaxial regions 107B-108B can be formed on substrate 106 and gate structures 112A, 112BC, 112D, and 112EF can be formed on fin regions 107A-108A. Gate structures 112A-112BC are formed in memory device area 101 and gate structures 112D-112EF are formed in logic device area 102 of semiconductor device 100. Gate structures 112BC and 112EF will be cut in subsequent processes to form gate structures 112B-112C and 112E-112F and isolation structures 103-104. The formation of fin structures 107-108 can include sequential operations of: (i) patterning substrate 106 to form fin regions 107A-108A, (ii) forming polysilicon gate structures (not shown) on portions of fin regions 107A-108B that will have gate structures 112BD, 112CE, 112A, and 112F formed in subsequent processes, (iii) etching back portions of fin regions 107A-108A that are not covered by the polysilicon gate structures, (iv) forming epitaxial regions 107B-108B on the etched back fin regions 107A-108A, and (v) replacing the polysilicon gate structures with gate structures 112A, 112BC, 112D, and 112EF.

Referring to FIG. 2, in operation 210, first and second isolation trenches are formed across first and second gate structures in the first and second device areas, respectively.

For example, isolation trenches 103* and 104* can be formed across gate structures 112BC and 112EF, respectively, as described with reference to FIGS. 4A-5D. The formation of isolation trenches 103*-104* can include sequential operations of: (i) depositing and patterning hard mask layers 423-424 on the structures of FIGS. 3A-3D to form openings 424*, and (ii) etching redundant gate portions 112* of gate structures 112BC and 112EF and redundant dielectric portions through openings 424*. The redundant dielectric portions includes portions of gate spacers 114, ESL 116, and ILD layer 118 on the sidewalls of redundant gate portions 112*.

In some embodiments, hard mask layer 423 can include a metal nitride layer (e.g., titanium nitride) or an oxide layer (e.g., $SiO_2$) and hard mask layer 424 can include a SiN layer. The SiN layer of hard mask layer 424 can be deposited using a chemical vapor deposition (CVD) process, unlike an atomic layer deposition (ALD) process used for the formation of SiN liners 103A-104A, as discussed in further detail below. Further, the SiN layer of hard mask layer 424 has a film density lower than that of SiN liners 103A-104A because the hydrogen atom concentration is higher in the SiN layer of hard mask layer 424. The higher hydrogen atom concentration is due to the hydrogen based gas (e.g., ammonia ($NH_3$) gas) used as a nitrogen precursor in the deposition of the SiN layer. According to some embodiments, hard mask layers 423-424 protect the underlying structures during the subsequent etching process to form isolation trenches 103*-104*.

Hard mask layer layers 423-424 can be patterned using a photolithography process followed by a dry etching process to form openings 424*. The dry etching process can include using a gas mixture of fluoromethane ($CH_3F$), oxygen, and argon. Openings 424* expose redundant gate portions 112* and the redundant dielectric portions that are removed in subsequent processes to form isolation trenches 103*-104*. Though openings 424* are shown to have straight sidewalls, openings 424* can have sloped sidewalls.

Figure 5A:
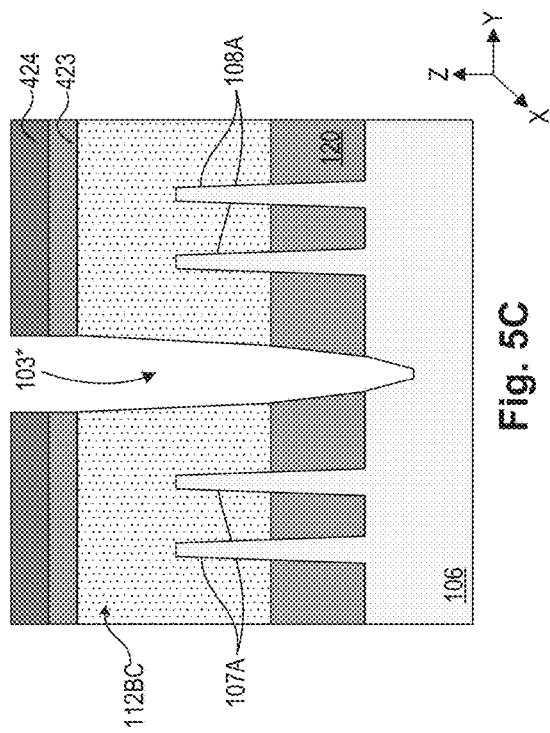

The etching process to remove the exposed structures through opening 424* can include a dry etching using an etchant that has a higher etch selectivity for the metallic material of gate portions 112* than the material of redundant dielectric portions. The second etchant can include a gas mixture of chlorine, methane ($CH_4$), boron chloride ($BCL_3$), and oxygen. The etching process is continued until STI regions 120 and substrate 106 underlying the etched gate portions 112* and dielectric portions are etched to form isolation trenches 103*-104*, as shown in FIGS. 5A-5D. In some embodiments, the redundant dielectric portions and the underlying portions of STI regions 120 and substrate 106 are removed in addition to removing gate portions 112* to ensure that the difficult to etch locations of isolation trenches 103*-104*, such as the corners and/or bottom of isolation trenches 103*-104* does not have any gate material residue. Isolation trench 103* cuts gate structures 112BC into gate structures 112B-112C, and isolation trench 104* cuts gate structures 112EF into gate structures 112E-112F, as shown in FIG. 5A.

Isolation trenches 103*-104* can be formed with similar heights H1, but with different average widths along an X-axis. The average width of isolation trench 103* is smaller than that of isolation trench 104* since gate length GL1 is smaller than gate length GL2. Since isolation trenches 103*-104* are formed by removing redundant gate portions 112*, the average widths of isolation trenches 103*-104* correspond to respective gate lengths GL1-GL2. In some embodiments, the average width of isolation trench 103* can range from about 20 nm to about 30 nm, and the average width of isolation trench 104* can range from about 30 nm to about 40 nm. Thus, isolation trenches formed in high density device areas (e.g., isolation trench 103* in memory device area 101) are narrower along an X-axis than isolation trenches formed in low density device areas (e.g., isolation trench 104* in logic device area 102).

Figure 5B:
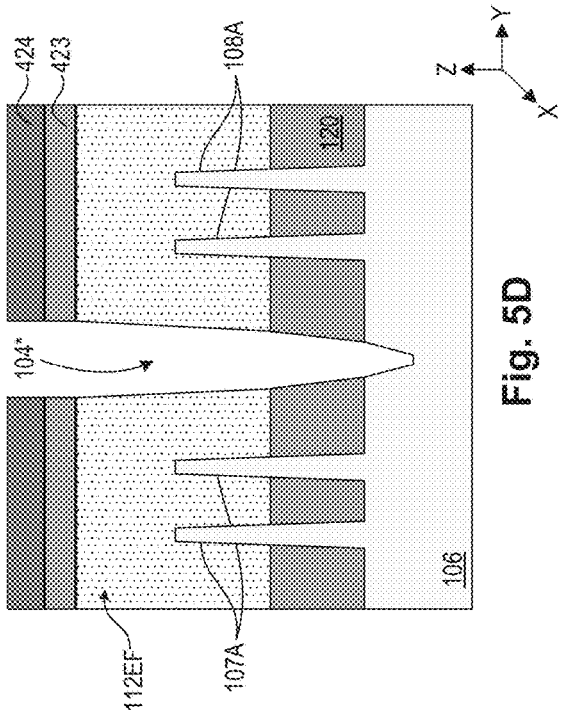
Figure 5C:
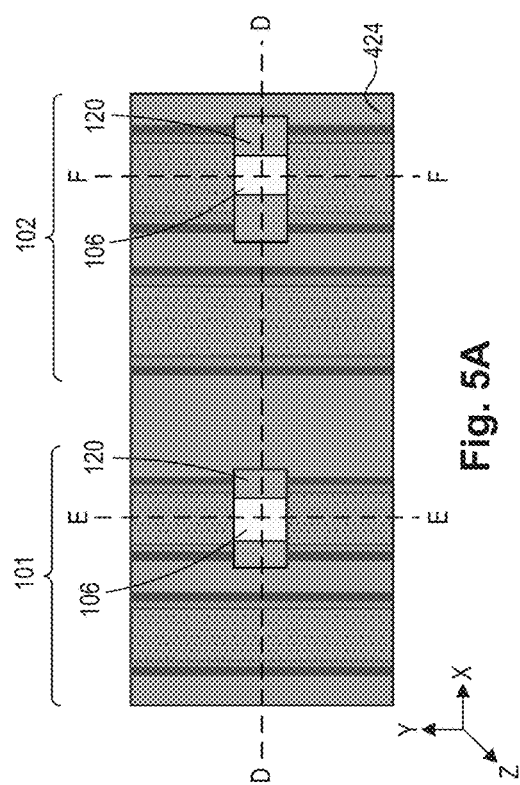
Figure 5D:
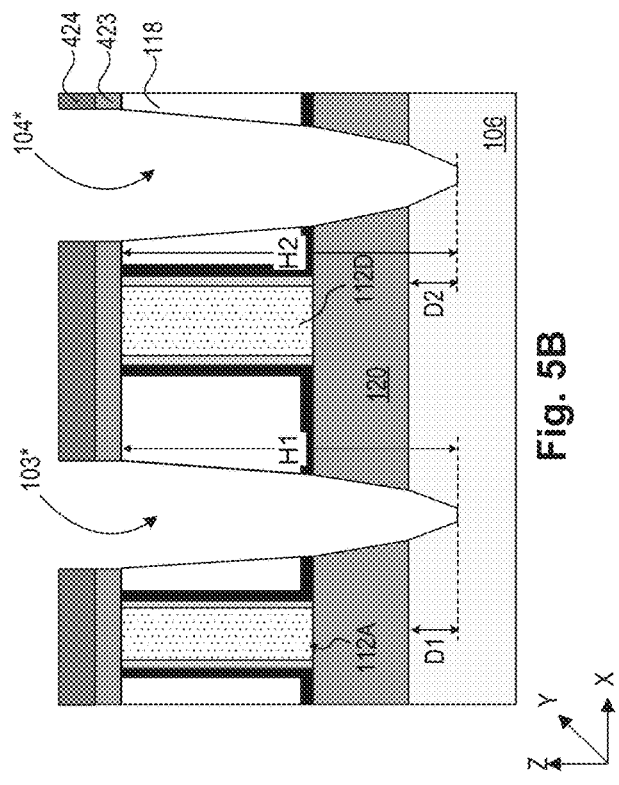

In some embodiments, heights H1-H2 can range from about 150 nm to about 300 nm with portions of trenches 103*-104* extending distances D1-D2 into substrate 106, as shown in FIGS. 5B-5D. If height H1-H2 are shorter than about 150 nm and/or distances D1-D2 are shorter than about 5 nm, the subsequently formed isolation structures 103-104 in isolation trenches 103*-104* may not be effective in preventing leakage between the p- and n-well regions in substrate 106, which can result in poor device performance. On the other hand, if height H1-H2 are greater than about 300 nm and/or distances D1-D2 are greater than about 150 nm, the etching time increases, consequently increasing device manufacturing cost. In some embodiments, heights H1-H2 can be equal to or different from each other. In some embodiments, distances D1-D2 can be equal to or different from each other. In some embodiments, height H2 can be greater than height H1 and distance D2 can be greater than distance D1.

Referring to FIG. 2, in operation 215, a nitride liner is deposited within the first and second isolation trenches. For example, as shown in FIGS. 6A-6D, a nitride liner 626 can be deposited substantially conformally on the structures of FIGS. 5A-5D. In some embodiments, nitride liner 626 can be deposited with a thickness ranging from about 4 nm to about 6 nm, a film density ranging from about 2.9 $g/cm^3$ to about 3.2 $g/cm^3$, and a wet etch rate ranging from about 0.5 nm/min to about 3 nm/min. In some embodiments, nitride liner 626 can include SiN. The first liner portion of nitride liner 626 deposited within isolation trench 103* form nitride liner 103A and the second liner portion of nitride liner 626 deposited within isolation trench 104* form nitride liner 104A in subsequent processing. The above discussion of nitride liners 103A and 104A applies to the respective first and second liner portions unless mentioned otherwise.

Thickness T1 of the first liner portion is less than thickness T2 of the second liner portion. Such a difference in thickness T1-T2 is due to the fact that the first liner portion is deposited at a deposition rate slower than the deposition rate at which the second liner portion is deposited within isolation trench 104*. This difference in deposition rates is due to the linear dependence of deposition rates on trench widths below 50 nm. Thus, since isolation trench 103* is narrower than isolation trench 104*, the first liner portion is deposited at a slower deposition rate than the second liner portion, which results in the first liner portion being thinner than the second liner portion.

In some embodiments, nitride liner 626 can be deposited at a temperature of about 400° C. to about 450° C., which is lower than other methods of depositing SiN layers. To deposit at such low temperatures, the deposition process can include (i) using a plasma enhanced ALD (PEALD) process, (ii) using a diiodosilane gas ($SiH_2I_2$) as a silicon precursor with a mixture of nitrogen and hydrogen gas, (iii) supplying the silicon precursor with a carrier gas of nitrogen into a deposition chamber at a flow rate of about 5 standard litre per minute (slm) to about 9 slm, (iv) supplying an RF power of about 600 W to about 800 W for a time period of about 1 sec to about 4 sec, and (v) depositing at a pressure of about 10 torr to about 20 torr.

In some embodiments, the process to deposit nitride liner 626 at a temperature of about 400° C. to about 450° C. can include (i) using a PEALD process, (ii) using a dichlorosilane gas ($SiH_2Cl_2$) as a silicon precursor, (iii) using $NH_3$ gas as a nitrogen precursor, (iv) supplying the silicon precursor with a carrier gas of nitrogen into a deposition chamber at a flow rate of about 5 slm to about 9 slm, (v) supplying an RF power of about 600 W to about 800 W for a time period of about 1 sec to about 4 sec, and (vi) depositing at a pressure of about 10 torr to about 20 torr. In some embodiments, nitride liner 626 film deposited using $SiH_2I_2$ and nitrogen gases as precursors can have a higher film density than that deposited using $SiH_2Cl_2$ and $NH_3$ gases as precursors. The lower film density for nitride liner 626 deposited using $SiH_2Cl_2$ and $NH_3$ gases as precursors can be due to the higher hydrogen atom concentration provided by the $NH_3$ gas.

Referring to FIG. 2, in operation 220, an oxide fill layer is deposited on the nitride liner. For example, as shown in FIGS. 7A-7D, an oxide fill layer 728 can be deposited on the structures of FIGS. 6A-6D to fill isolation trenches 103*-104* with oxide fill layer 728. Oxide fill layer 728 can include $SiO_2$ or $SiO_2$-based material. In some embodiments, oxide fill layer 728 can be deposited using a PEALD process at a temperature of about 200° C. to about 260° C. The deposition process can further include (i) using a Bis(diethylamido)silane gas (($Et2n)_2SiH_2$) as a silicon precursor, (ii) supplying the silicon precursor with a carrier gas of argon into a deposition chamber at a flow rate of about 1 slm to about 2 slm, (iii) supplying an oxygen plasma with an RF power of about 15 W to about 100 W for a time period of about 0.5 min to about 1 min, and (vi) depositing at a pressure of about 2 torr to about 5 torr.

Referring to FIG. 2, in operation 225, top surfaces of the nitride liner and oxide fill layer are coplanarized with top surfaces of the gate structures. For example, top surfaces of nitride liner 626 and oxide fill layer 728 can be coplanarized with top surfaces of gate structures 112A and 112D to form nitride liners 103A-104A and oxide fill layers 103B-104B, as shown in FIGS. 8B-8D. In some embodiments, a chemical mechanical polishing (CMP) process can be performed on the structures of FIGS. 7A-7D to form the structures of FIGS. 8A-8D.

In some embodiments, instead of operation 220 following operation 215, an oxide liner can be deposited on the structures of FIGS. 6A-6D followed by the deposition of a second nitride liner, similar to nitride liner 626, on the oxide liner, which can be followed by the deposition of oxide fill layer 728 on the second nitride liner. Such a stack of nitride liner 626, oxide liner, second nitride liner, and oxide fill layer 728 can form the dielectric stack of isolation structures 103-104, as shown in FIG. 1F after a CMP process of operation 225 is performed on the stack.

Figure 9D:
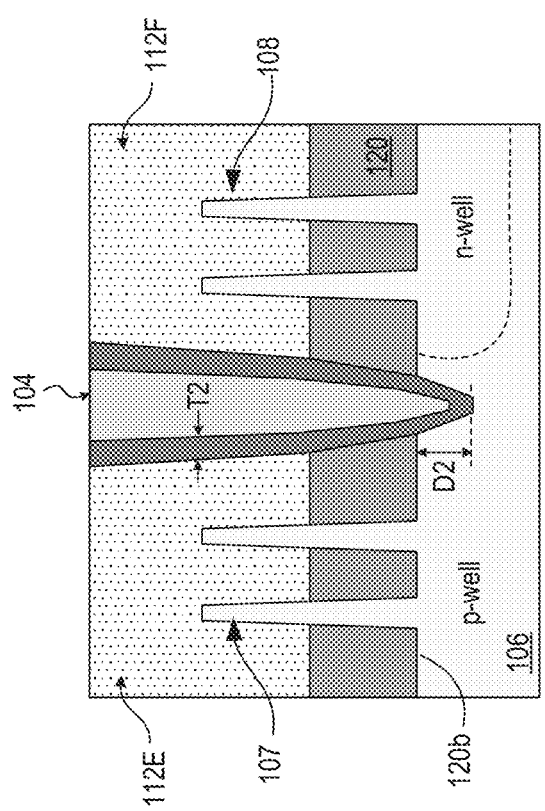
Figure 9C:
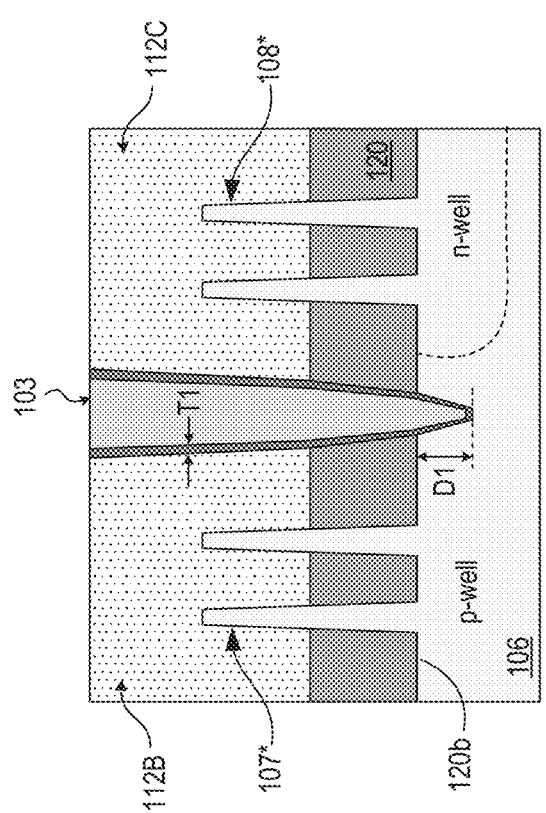

In some embodiments, instead of finFETs of semiconductor 100 being formed on common fin structures 107-108 in device areas 101-102, finFETs of semiconductor 100 can be formed on different fin structures in different device areas. For example, finFETs of semiconductor 100 can be formed on fin structures 107*-108* in device area 101 and finFETs of semiconductor 100 can be formed on fin structures 107-108 in device area 102, as shown in FIGS. 9A-9D. FIG. 9A illustrates a top view of semiconductor device 100 with finFETs formed on different fin structures 107*-108* and 107-108 in different device areas 101-102. FIGS. 9B-9D illustrate cross-sectional views along lines A-A, B-B, and C-C of FIG. 9A. The discussion of fin structures 107-108 applies to fin structures 107*-108* unless mentioned otherwise. Elements in FIGS. 9A-9D with the same annotations as elements in FIGS. 1A-1F are described above. The finFETs of FIGS. 9A-9D can be formed on different regions of same substrate 106 using the operations of method 200 described above.

The present disclosure provides example isolation structures (e.g., isolation structures 103-104) for reducing parasitic capacitance in a semiconductor device (e.g., semiconductor device 100) with finFETs and example methods for fabricating the same. In some embodiments, the isolation structure can be formed by partially replacing the SiN fill with a lower dielectric constant material, such as silicon oxide ($SiO_2$) and $SiO_2$-based material (e.g., silicon oxycarbide) to reduce the dielectric constant of the isolation structure. The isolation structure can be formed by first depositing a SiN liner (e.g., SiN liners 103A-104A) in the isolation trench, followed by filling the isolation trench with $SiO_2$ or $SiO_2$-based material (e.g., oxide fill layers 103B-104B). Since $SiO_2$ or a $SiO_2$-based material has a dielectric constant equal to or less than about 3.9, the bi-layer dielectric fill of SiN and $SiO_2$ or SiN and $SiO_2$-based material can reduce the dielectric constant of the isolation structure by about 30% to about 50% compared to isolation structures with only SiN fill. Further, the isolation structure can extend into the substrate of the semiconductor device and provide electrical isolation between p- and n-well regions under the finFETs. In some embodiments, the isolation structure (e.g., isolation structures 105) can be formed to cut fin structures of the finFETs to electrically the separated fin structures from each other.

In some embodiments, the isolation structures (e.g., isolation structures 103-104) with different dielectric constants can be formed at the same time in different device areas (e.g., memory device area 101 and logic device area 102) of the semiconductor device. The dielectric constant of the isolation structures can be varied by varying the thickness of the SiN liner in the bi-layer dielectric fill. The process of forming the isolation structures with different dielectric constants at the same time can eliminate CMG process-related variability associated with forming multiple isolation structures across the semiconductor device. Reducing process-related variability across the semiconductor device can reduce performance variability across the finFETs and device manufacturing cost.

In some embodiments, a semiconductor device includes a substrate with a first device area and a second device area, fin structures with first fin portions disposed on the first device area and second fin portions disposed on the second device area, a first pair of gate structures disposed on the first fin portions in the first device area, and a second pair of gate structures disposed on the second fin portions in the second device area. The second pair of gate structures is electrically isolated from the first pair of gate structures. The semiconductor device further includes a first isolation structure interposed between the first pair of gate structures and a second isolation structure interposed between the second pair of gate structures. The first isolation structure includes a first nitride liner and a first oxide fill layer. The second isolation structure includes a second nitride liner and a second oxide fill layer. The second nitride liner is thicker than the first nitride liner.

In some embodiments, a semiconductor device includes a substrate with a memory device area and a logic device area, fin structures with first fin portions disposed on the memory device area of the substrate and second fin portions disposed on the logic device area of the substrate, a first pair of gate structures disposed on the first fin portions in the memory device area, a second pair of gate structures disposed on the second fin portions in the logic device area. The second pair of gate structures is electrically isolated from the first pair of gate structures. The semiconductor device further includes a first isolation structure interposed between the first pair of gate structures and a second isolation structure interposed between the second pair of gate structures. The first isolation structure includes a first pair of nitride liners, a first oxide liner interposed between the first pair of nitride liners, and a first oxide fill layer. The second isolation structure includes a second pair of nitride liners, a second oxide liner interposed between the second pair of nitride liners, and a second oxide fill layer. The second oxide liner is thicker than the first oxide liner.

In some embodiments, a method includes forming first and second gate structures on first and second fin structures disposed on a substrate, forming first and second isolation trenches across the first and second gate structures, respectively. The first isolation trench divides the first gate structure into a first pair of gate structures electrically isolated from each other and the second isolation structure divides the second gate structure into a second pair of gate structures electrically isolated from each other. The forming the first and second isolation trenches includes forming the first isolation trench to extend a first distance into the substrate and forming the second isolation trench to extend a second distance into the substrate. The second distance is substantially equal to the first distance. The method further includes forming first and second isolation structures within the first and second isolation trenches, respectively. The forming the first and second isolation structures includes forming the first isolation structure with a first dielectric constant and forming the second isolation structure with a second dielectric constant higher than the first dielectric constant.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate with a first device area and a second device area;
   first and second fin structures, wherein each of the first and second fin structures comprises a first fin portion disposed on the first device area and a second fin portion disposed on the second device area;
   a first pair of gate structures disposed on the first fin portions of the first and second fin structures in the first device area;
   a second pair of gate structures disposed on the second fin portions of the first and second fin structures in the second device area, wherein the second pair of gate structures is electrically isolated from the first pair of gate structures;
   a first isolation structure interposed between the first pair of gate structures, wherein the first isolation structure comprises a first nitride liner and a first oxide fill layer; and
   a second isolation structure interposed between the second pair of gate structures, wherein the second isolation structure comprises a second nitride liner and a second oxide fill layer and wherein the second nitride liner is thicker than the first nitride liner, and wherein the first and second isolation structures are substantially parallel to each other and to the first and second fin structures.

2. The semiconductor device of claim 1, wherein first and second portions of the first and second isolation structures, respectively, are embedded in the substrate.

3. The semiconductor device of claim 1, wherein first and second portions of the first and second isolation structures, respectively, are embedded in a shallow trench isolation region disposed on the substrate.

4. The semiconductor device of claim 1, wherein the first isolation structure extends into the substrate by a first distance and the second isolation structure extends into the substrate by a second distance that is different from the first distance.

5. The semiconductor device of claim 1, wherein the first and second nitride liners comprise a silicon nitride material and the first and second oxide fill layers comprise a silicon oxide based material.

6. The semiconductor device of claim 1, wherein a dielectric constant of the first isolation structure is lower than a dielectric constant of the second isolation structure.

7. The semiconductor device of claim 1, wherein an average width of the first oxide fill layer is less than an average width of the second oxide fill layer.

8. The semiconductor device of claim 1, wherein an average width of the first isolation structure corresponds to a gate length of the first pair of gate structures and an average width of the second isolation structure corresponds to a gate length of the second pair of gate structures.

9. The semiconductor device of claim 1, wherein a gate pitch of the first pair of gate structures is smaller than a gate pitch of the second pair of gate structures.

10. The semiconductor device of claim 1, wherein an average width of the first isolation structure is less than an average width of the second isolation structure.

11. A semiconductor structure, comprising:
    a substrate with a memory device area and a logic device area;
    fin structures with first fin portions disposed on the memory device area and second fin portions disposed on the logic device area;
    a first pair of gate structures disposed on the first fin portions in the memory device area;
    a second pair of gate structures disposed on the second fin portions in the logic device area, wherein the second pair of gate structures is electrically isolated from the first pair of gate structures;
    a first isolation structure interposed between the first pair of gate structures, wherein the first isolation structure comprises a first pair of nitride liners, a first oxide liner interposed between the first pair of nitride liners, and a first oxide fill layer; and
    a second isolation structure interposed between the second pair of gate structures, wherein the second isolation structure comprises a second pair of nitride liners, a second oxide liner interposed between the second pair of nitride liners, and a second oxide fill layer, and wherein the second oxide liner is thicker than the first oxide liner.

12. The semiconductor device of claim 11, wherein the second pair of nitride liners is thicker than the first pair of nitride liners.

13. The semiconductor device of claim 11, wherein the first oxide liner is thicker than each nitride liner of the first pair of nitride liners.

14. The semiconductor device of claim 11, wherein first and second portions of the first and second isolation structures, respectively, are embedded in the substrate.

15. The semiconductor device of claim 11, wherein a dielectric constant of the first isolation structure is lower than a dielectric constant of the second isolation structure.

16. A method, comprising:
  forming first and second gate structures on first and second fin structures disposed on a substrate;
  forming first and second isolation trenches across the first and second gate structures, respectively,
  wherein the first and second isolation trenches are substantially parallel to the first and second fin structures,
  wherein the first isolation trench divides the first gate structure into a first pair of gate structures electrically isolated from each other and the second isolation structure divides the second gate structure into a second pair of gate structures electrically isolated from each other, and
  wherein the forming the first and second isolation trenches comprises forming the first isolation trench to extend a first distance into the substrate and forming the second isolation trench to extend a second distance into the substrate, wherein the second distance is substantially equal to the first distance; and
  forming first and second isolation structures within the first and second isolation trenches, respectively, wherein the forming the first and second isolation structures comprises forming the first isolation structure with a first dielectric constant and forming the second isolation structure with a second dielectric constant higher than the first dielectric constant.

17. The method of claim 16, wherein the forming the first and second isolation structures comprises depositing a nitride liner within the first and second isolation trenches, wherein a first portion of the nitride liner is deposited at a first deposition rate within the first isolation trench and a second portion of the nitride liner is deposited at a second deposition rate within the second isolation trench, and wherein the second deposition rate is faster than that the first deposition rate.

18. The method of claim 16, wherein the forming the first and second isolation structures comprises depositing a nitride liner within the first and second isolation trenches, wherein a first portion of the nitride liner is deposited with a first thickness within the first isolation trench and a second portion of the nitride liner is deposited with a second thickness within the second isolation trench, and wherein the second thickness is greater than the first thickness.

19. The method of claim 16, wherein the forming the first and second isolation structures comprises:
  depositing a nitride liner within the first and second isolation trenches; and
  depositing an oxide fill layer on the nitride liner.

20. The method of claim 16, wherein the forming the first and second isolation structures comprises:
  depositing a first nitride liner within the first and second isolation trenches;
  depositing an oxide liner on the first nitride liner;
  depositing a second nitride liner on the oxide liner; and
  depositing an oxide fill layer on the second nitride liner.

* * * * *